United States Patent
Spencer et al.

(10) Patent No.: US 7,790,528 B2
(45) Date of Patent: Sep. 7, 2010

(54) DUAL SUBSTRATE ORIENTATION OR BULK ON SOI INTEGRATIONS USING OXIDATION FOR SILICON EPITAXY SPACER FORMATION

(75) Inventors: Gregory S. Spencer, Pflugerville, TX (US); John M. Grant, Austin, TX (US); Gauri V. Karve, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 582 days.

(21) Appl. No.: 11/742,778

(22) Filed: May 1, 2007

(65) Prior Publication Data

US 2008/0274595 A1 Nov. 6, 2008

(51) Int. Cl.
*H01L 21/84* (2006.01)
(52) U.S. Cl. ............... 438/154; 438/198; 257/E21.637
(58) Field of Classification Search ........... 438/296, 438/198
See application file for complete search history.

(56) References Cited

U.S. PATENT DOCUMENTS

| | | | |
|---|---|---|---|
| 6,635,543 B2 * | 10/2003 | Furukawa et al. ......... 438/311 |
| 6,815,278 B1 | 11/2004 | Ieong et al. ............... 438/198 |
| 7,023,055 B2 | 4/2006 | Ieong et al. ............... 257/369 |
| 7,023,057 B2 | 4/2006 | Ieong et al. ............... 257/369 |
| 7,187,035 B2 * | 3/2007 | Nagano et al. ............ 257/347 |
| 7,498,216 B2 * | 3/2009 | Nowak ..................... 438/198 |
| 2005/0029619 A1 | 2/2005 | Forbes ...................... 257/516 |
| 2005/0087842 A1 | 4/2005 | Forbes ...................... 257/617 |
| 2005/0093077 A1 | 5/2005 | Ieong et al. ............... 257/369 |
| 2005/0093104 A1 | 5/2005 | Ieong et al. ............... 257/627 |
| 2005/0236687 A1 | 10/2005 | Chan et al. ................ 257/482 |
| 2006/0049460 A1 * | 3/2006 | Chen et al. ................ 257/347 |
| 2006/0060925 A1 * | 3/2006 | Doris et al. ............... 257/369 |
| 2006/0073646 A1 | 4/2006 | Yang ........................ 438/152 |
| 2008/0064160 A1 * | 3/2008 | Kim et al. ................. 438/233 |
| 2008/0087961 A1 * | 4/2008 | Wang et al. ............... 257/351 |

* cited by examiner

*Primary Examiner*—Chandra Chaudhari
(74) *Attorney, Agent, or Firm*—Hamilton & Terrile, LLP; Michael Rocco Cannatti

(57) ABSTRACT

A semiconductor process and apparatus provide a planarized hybrid substrate (15) by thermally oxidizing SOI sidewalls (90) in a trench opening (93) to form SOI sidewall oxide spacers (94) which are trimmed while etching through a buried oxide layer (80) to expose the underlying bulk substrate (70) for subsequent epitaxial growth of an epitaxial semiconductor layer (96). In this way, SOI sidewall oxide spacers (94) are formed that prevent epitaxial SOI sidewalls from being formed in the trench opening (93) during the epitaxial growth step, and that can be readily removed during any subsequent STI etch process

21 Claims, 5 Drawing Sheets

DUAL SUBSTRATE ORIENTATION OR BULK ON SOI INTEGRATIONS USING OXIDATION FOR SILICON EPITAXY SPACER FORMATION

BACKGROUND OF THE INVENTION

1. Field of the Invention

The present invention is directed in general to the field of semiconductor devices. In one aspect, the present invention relates to high-performance complementary metal oxide semiconductor (CMOS) field effect transistors (FETs) fabricated on epitaxially grown substrates.

2. Description of the Related Art

To address the difference in electron and hole mobility values for NMOS and PMOS transistor devices formed on semiconductor wafers having a single crystal orientation, CMOS devices are increasingly fabricated with hybrid substrates with different surface orientations that are formed using Dual Substrate Orientation (DSO) integrations. Such hybrid substrates provide PMOS and NMOS devices with their own optimized crystal orientation. In addition, while some devices exhibit performance improvement from being fabricated on semiconductor-on-insulator (SOI) substrates, others benefit from being fabricated on bulk substrates. In order to provide benefit to both device types, Bulk on SOI (BOS) integrations where bulk regions are formed in semiconductor-on-insulator (SOI) substrates are desired. Prior attempts to integrate DSO or BOS substrates have used epitaxial growth to form one of the crystal surface orientations, but the epitaxial growth process can cause epitaxial Si growth on the SOI sidewalls during epitaxial growth of the silicon on the bulk substrate, as illustrated in FIGS. 1-2. In particular, FIG. 1 shows a conventionally formed dual surface orientation wafer structure 31 in which a trench opening 6 is formed through the nitride hardmask layer 5, pad oxide layer 4, semiconductor-on-insulator (SOI) layer 3 and buried oxide layer 2 to expose the substrate 1. When epitaxial silicon 7 is grown from the substrate 1 (as depicted in FIG. 2), the epitaxial growth process simultaneously creates SOI sidewalls 8 from the exposed silicon in the SOI layer 3, thereby causing defectivity in the crystalline structure of the epitaxial silicon formed in the trench 6 where the epitaxial layers 7 and 8 meet.

Prior attempts to prevent the formation of SOI sidewalls have formed nitride sidewall spacers 9 on the sides of the trench opening 6 prior to growing epitaxial silicon from the exposed substrate 1. As shown in FIG. 3, the nitride sidewall spacers 9 are typically formed by depositing a layer of silicon nitride over the wafer structure 33 and then anisotropically etching the nitride layer so that spacers 9 remain on the sides of the trench opening 6. With the nitride sidewall spacers 9 in place, epitaxial silicon 10 can be grown from the substrate 1 in the trench opening 6 from the bottom up (as depicted in FIG. 4). However, the presence of the nitride sidewall spacers 9 can result in increased integration complexity due to the significant challenges for subsequently etching the Shallow Trench Isolation (STI) regions. In particular and as depicted in FIG. 5, when nitride hardmask regions 5, 21 (and pad oxide layers 4, 20) are used to define the STI etch regions 22, the presence of the nitride sidewall spacers 9 complicates the selection of the STI etch chemistry which must simultaneously etch silicon (from SOI layer 3 and epi layer 10), silicon dioxide (from the buried oxide layer 2) and nitride (from nitride sidewall spacers 9) while using the silicon nitride hardmask 5, 21. For example, if an STI etch process is used that is selective to nitride, the etch process will leave residual nitride spacer 9 in the STI region 22.

Accordingly, a need exists for a semiconductor manufacturing process which prevents SOI sidewalls from being formed during epitaxial growth of an epi layer from the underlying substrate. There is also a need for a fabrication process which reduces the complexity of DSO or BOS integration. In addition, there is a need for an epitaxial substrate fabrication process which simplifies the STI etch process and reduces crystalline defectivity. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
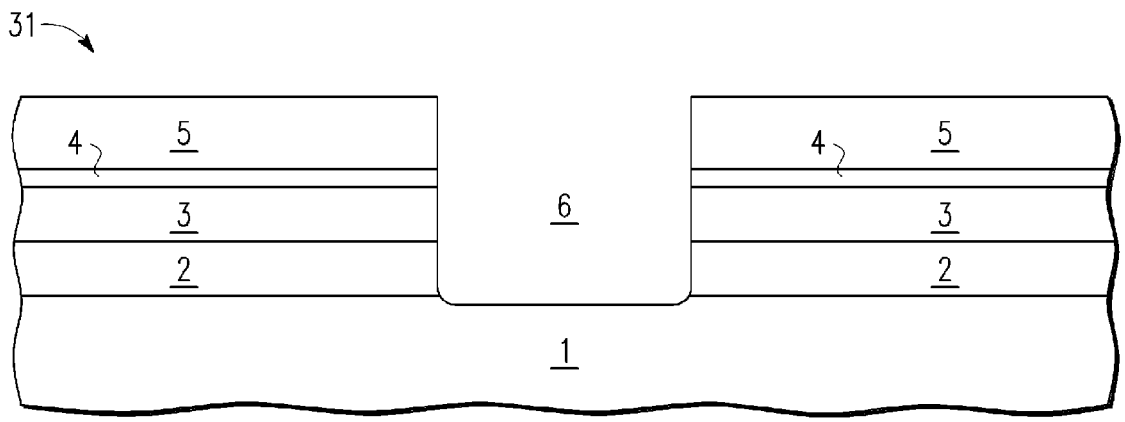
FIG. 1 is a partial cross-sectional view of a conventionally formed dual surface orientation wafer structure after formation of a trench opening.
Figure 2:
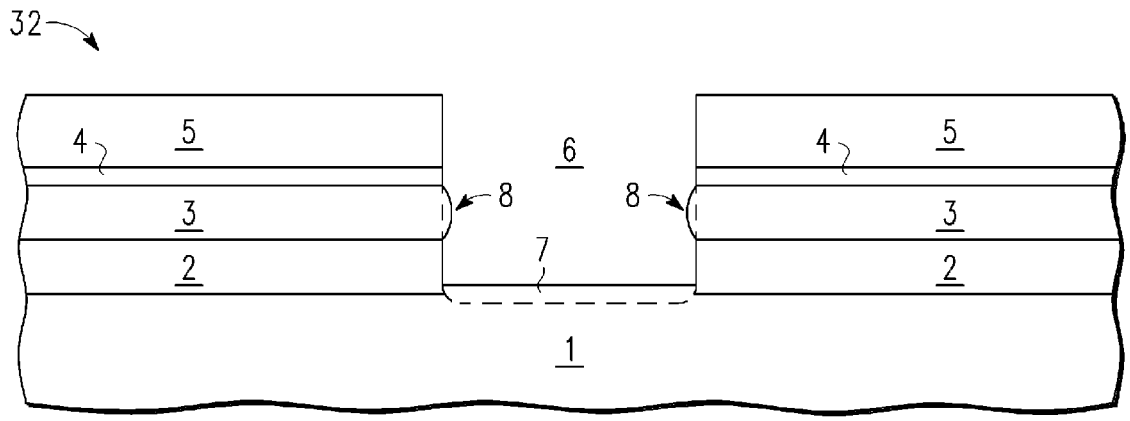
FIG. 2 illustrates processing subsequent to FIG. 1 after formation of SOI sidewalls during epitaxial growth of silicon in the trench opening.
Figure 3:
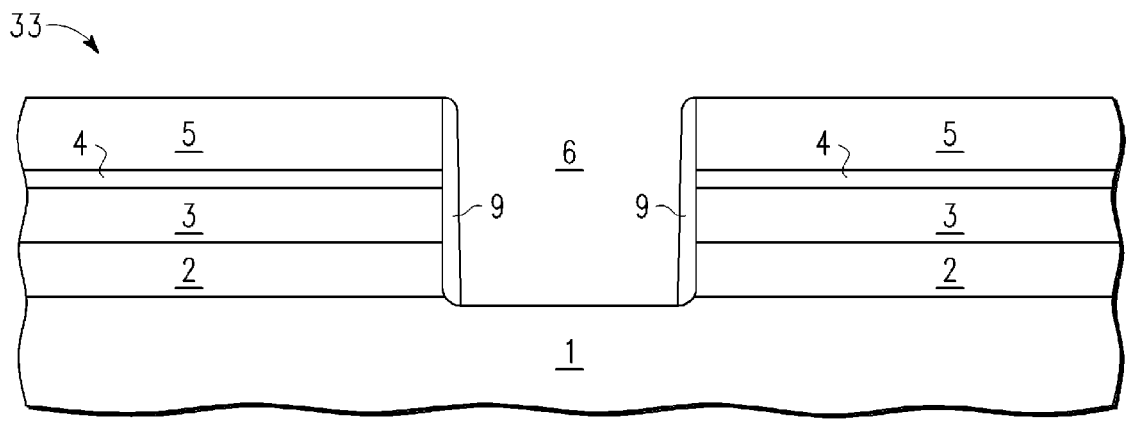
FIG. 3 illustrates processing subsequent to FIG. 1 after nitride sidewall spacers are formed on the sides of the trench opening.
Figure 4:
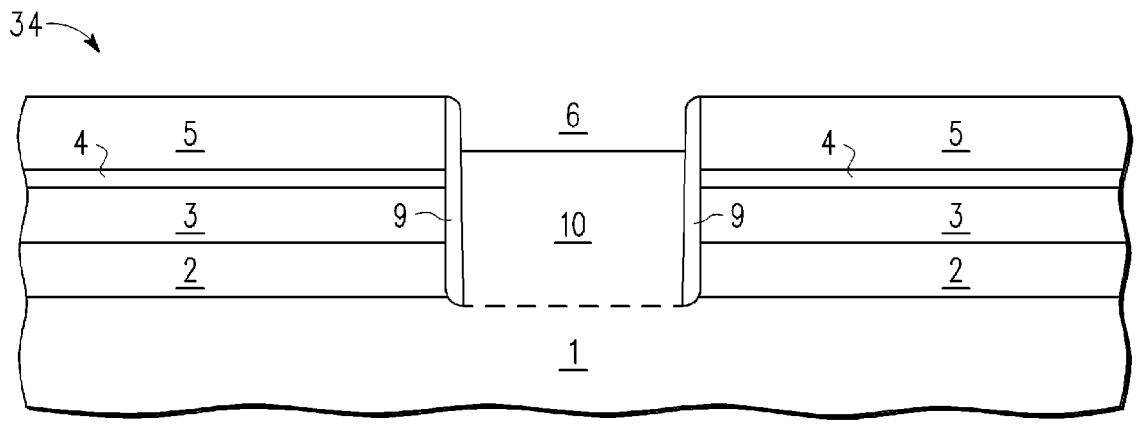
FIG. 4 illustrates processing subsequent to FIG. 3 during epitaxial growth of silicon in the trench opening.
Figure 5:
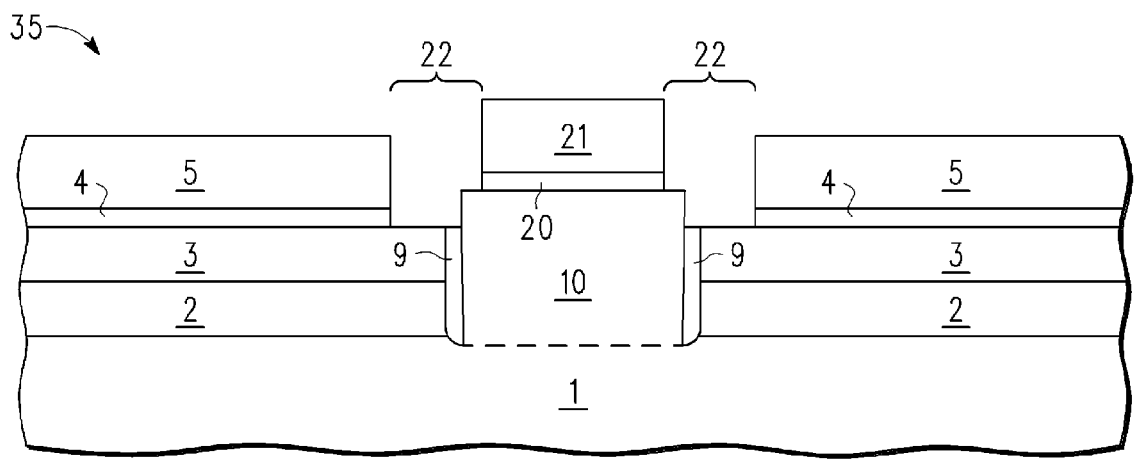
FIG. 5 illustrates processing subsequent to FIG. 4 after STI etch regions are defined in a nitride mask and pad oxide.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate,

DETAILED DESCRIPTION

A method and apparatus are described for fabricating high performance CMOS devices with hybrid substrates by oxidizing SOI sidewalls in a trench opening to form SOI sidewall oxide spacers for DSO and BOS selective epitaxial silicon growth. As a preliminary matter, SOI sidewall oxide spacers are formed in a trench opening, such as by applying a thermal oxidation process which converts the SOI semiconductor layer to an oxide, e.g., silicon dioxide. After formation of the SOI sidewall oxide spacers, a buried oxide etch process simultaneously trims the SOI sidewall oxide spacers while extending the trench opening through a buried oxide layer to expose the underlying bulk substrate for subsequent epitaxial growth. In this way, SOI sidewall spacers are formed that prevent epitaxial growth on the SOI sidewalls in the trench opening during the epitaxial growth step. These sidewall spacers can be readily removed during any subsequent STI etch process without requiring any complex STI etch chemistry. Thus, integration of DSO substrates is promoted by growing SOI sidewall oxide spacers prior to forming an epitaxial semiconductor substrate so that the resulting structure can be substantially planarized with a CMP process to form hybrid substrates on which semiconductor devices may be fabricated.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 6:
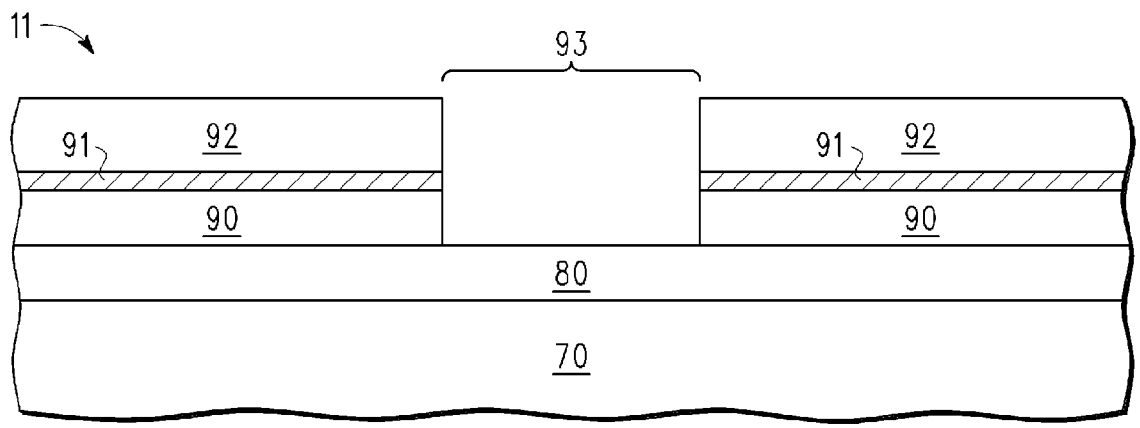
FIG. 6 is a partial cross-sectional view of a semiconductor wafer structure having SOI layers formed over a semiconductor substrate where a trench opening has been formed through an SOI semiconductor layer to expose a buried oxide layer.

Turning now to FIG. 6, a partial cross-sectional view is illustrated of a semiconductor wafer structure 11 having semiconductor-on-insulator (SOI) layers 90, 80, respectively, located over a semiconductor substrate layer 70 where a trench opening 93 has been formed through an SOI semiconductor layer 90 to expose a buried oxide layer 80. Specifically, the structure 11 includes a first semiconductor layer 70 formed of a semiconductor material that has a first crystallographic orientation. Depending on the type of transistor device being fabricated, the first semiconductor layer 70 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. As will be appreciated, the semiconductor layer 70 may be appropriately doped to provided n-type (electron) and p-type (hole) carriers.

In the SOI layers, the structure 11 includes an insulator layer 80 located on the first semiconductor layer 70 which will ultimately be used to form the buried oxide (BOX) layer for silicon-on-insulator devices. In addition, the SOI layers include a second semiconductor layer 90 formed of a semiconductor material which has a second crystallographic orientation which may be different from the first crystallographic orientation, though the first and second crystallographic orientations can also be the same. Depending on the type of transistor device being fabricated, the second semiconductor layer 90 may be formed from any semiconductor material, including, for example, Si, SiC, SiGe, SiGeC, Ge, GaAs, InAs, InP as well as other III/V or II/VI compound semiconductors or any combination thereof. It will also be appreciated that the second semiconductor layer 90 may be appropriately doped to provided n-type (electron) and p-type (hole) carriers. The crystallographic orientation of the second semiconductor layer 90 may be (100), (111), or (110), and may be selected so that it is different from the crystallographic orientation of the first semiconductor layer 70 in the case of DSO integrations. The crystal orientations of the first semiconductor layer 70 and the second semiconductor layer 90 will depend on the materials used to form the wafer structure 11. For example, when silicon is employed as the semiconductor material, electron mobility is higher on a (100) surface orientation, and hole mobility is higher on a (110) surface orientation provided that the channel direction is oriented in the (110) direction. In this case, the (100) Si surface is used as the substrate layer when forming bulk NMOS devices, while the (110) Si surface is used as the substrate layer when forming bulk PMOS devices. As depicted in FIG. 6, an oxide layer 91 (e.g., pad oxide) is formed on the second semiconductor layer 90, followed by deposition of a nitride layer 92.

As further shown in FIG. 6, portions of the nitride layer 92, oxide layer 91 and the second semiconductor layer 90 have been removed to form the trench opening 93 to expose a buried oxide layer 80. This may be accomplished using any desired selective etch process. For example, after forming the oxide layer 91 and nitride layer 92, a mask layer (not shown) may optionally be formed on an exposed upper surface of the nitride layer 92. Using the oxide layer 91 and nitride layer 92 (and optional mask layer), conventional patterning and anisotropic etching techniques may be used to form an opening 93 through the second semiconductor layer 90 to expose a buried oxide layer 80. While not shown, the anisotropic etch may remove a portion of buried oxide layer 80. Indeed, in selected embodiments, it may be advantageous to etch some part of buried oxide layer 80 because this exposes the underside of the second semiconductor layer 90 at the side edge to the subsequent thermal oxidation process (described hereinbelow), thereby moving the spacer/BOX interface away from second semiconductor layer 90 so that any subsequent pre-epi clean processes do not expose second semiconductor layer 90.

Figure 7:
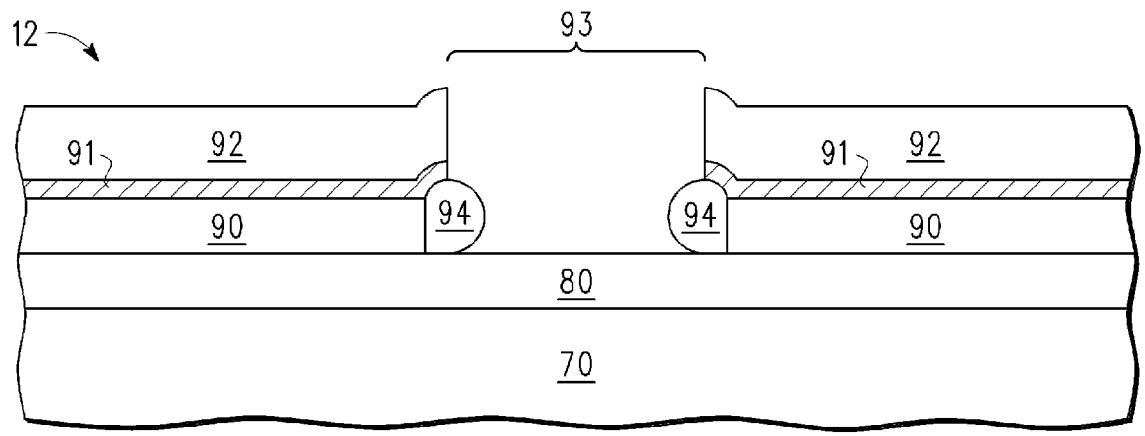
FIG. 7 illustrates processing subsequent to FIG. 6 where SOI sidewall spacers have been formed by thermal oxidation.

FIG. 7 illustrates processing of a semiconductor wafer structure 12 subsequent to FIG. 6 after SOI sidewall oxide spacers 94 are formed by a thermal oxidation process which grows silicon dioxide spacers at the exposed sidewalls of the SOI layer 90. Due to the selective nature of the thermal oxidation process, silicon dioxide is formed only at the exposed sidewalls of the SOI layer 90, and not elsewhere on the semiconductor wafer structure 12. However, the SOI sidewall oxide spacers 94 that are formed by growing a layer of silicon dioxide may create a "bird's beak" effect that lifts or separates the oxide layer 91 and nitride layer 92 from the underlying semiconductor layer 70. This effect results from the fact that the material for the SOI sidewall oxide spacers 94 is created at the exposed sidewall surface of the SOI semiconductor layer 90.

Figure 8:
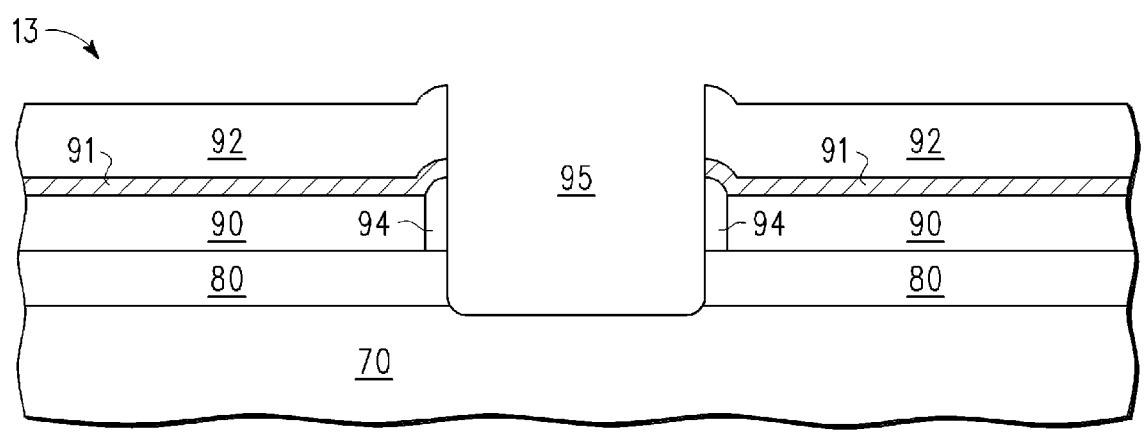
FIG. 8 illustrates processing subsequent to FIG. 7 after a buried oxide etch trims the SOI sidewall spacers and exposes the underlying substrate.

FIG. 8 illustrates processing of a semiconductor wafer structure 13 subsequent to FIG. 7 after a buried oxide etch trims the SOI sidewall oxide spacers 94 and exposes the underlying substrate 70. At this stage, the remaining portions of the nitride layer 92 and oxide layer 91 (and optional mask layer) may be used as a mask during an anisotropic etch of the buried oxide layer 80. In this way, a pattern and etch process is used to selectively etch or remove exposed portions of the SOI sidewall oxide spacers 94 and a buried oxide layer 80, thereby forming a second etch opening 95 to the exposed first semiconductor layer 70. The pattern transfer and etching of the mask layer may use one or more etching steps to selectively remove the unprotected portions of the SOI sidewall oxide spacers 94 and a buried oxide layer 80, including a dry etching process such as reactive-ion etching, ion beam etching, plasma etching or laser etching, a wet etching process wherein a chemical etchant is employed or any combination thereof.

The opening 95 is used to define and differentiate active regions for first and second types of MOS devices subsequently formed on the wafer structure 13. For example, the unetched portions of the second semiconductor layer 90 define a first device region for a first type of MOS device, while the portions of the first semiconductor layer 70 that is exposed by the opening 95 (and that is subsequently epitaxially regrown, as described hereinbelow) defines a second device region for a second type of MOS device. To this end, the unetched portions of the buried oxide layer 80 may be used to form at least part of the shallow trench isolation regions for electrically and physically isolating the first and second device regions from one another.

Figure 9:
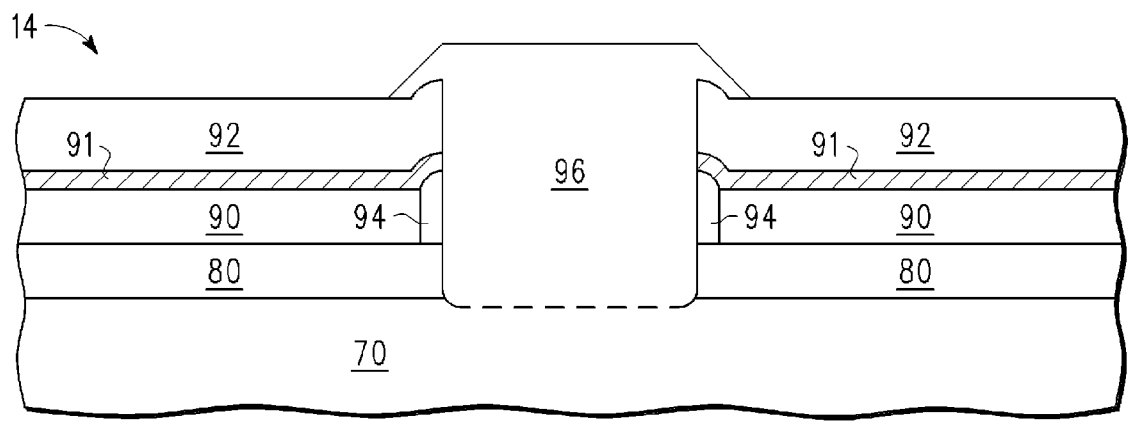
FIG. 9 illustrates processing subsequent to FIG. 8 after an epitaxial semiconductor layer is selectively formed to partially or completely fill the trench opening.

Turning now to FIG. 9, processing of a semiconductor wafer structure 14 subsequent to FIG. 8 is illustrated after an epitaxial semiconductor layer 96 is selectively formed to partially or completely fill the trench opening 95 so that it is higher than the second semiconductor layer 90 and/or the mask layers 91, 92. As described herein and understood by those skilled in the art, the process of forming an epitaxial layer may be described as either depositing or growing a layer so that the "growth" and "deposition" terms are used interchangeably with respect to epitaxial formation. By selectively forming the epitaxial semiconductor layer 96 so that its crystallographic orientation is different from the crystallographic orientation of the second semiconductor layer 90, the mobility of the holes and electrons for subsequently formed PMOS and NMOS devices, respectively, may be optimized. Since the regrown semiconductor layer 96 is epitaxially grown from the first semiconductor layer 70, they will have the same crystallographic orientations, though the layers 70, 96 can be formed of different semiconductor materials. Depending on the type of transistor device being fabricated, the epitaxial semiconductor layer 96 may be formed from any (doped or undoped) semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility. For example, if PMOS devices are formed over the epitaxial semiconductor layer 96, the epitaxial semiconductor layer 96 may be formed by epitaxially growing silicon having a crystallographic orientation (e.g., (110)) that is the same as the crystallographic orientation of the first semiconductor layer 70. This epitaxial growth may be achieved by heating the semiconductor wafer structure 14 to a temperature between 500 and 900° C. in the presence of dichlorosilane, HCL and hydrogen gas. Alternatively, if NMOS devices are formed over the epitaxial semiconductor layer 96, at least a portion of the epitaxially grown layer 96 may be formed by epitaxially growing silicon having a (100) crystallographic orientation. In this case, the second semiconductor layer 90 would have a (110) crystallographic orientation, and the PMOS device would be built on this layer. By optimizing the crystallographic orientations of the layers 90, 96 (e.g., so that the epitaxially grown layer 96, or "epi-layer," is formed of (110) semiconductor material and the second semiconductor layer 90 is formed of (100) semiconductor material), significant mobility improvements are obtained over single-orientation substrates—up to 2.5×improvement for hole mobility in PMOS devices formed on (110) Si compared to (100) Si when formed over silicon dioxide gate layers. In addition, by completely filling the trench opening 95 with an epitaxial semiconductor layer 96 that grows above and over the nitride mask layer 92, crystalline defectivity in the trench opening 95 is reduced or minimized. It will be appreciated that, when the epi layer 96 is formed with n-type material, the second semiconductor layer 90 in the SOI region may be formed of depositing strained p-type semiconductor material having a second crystal orientation that is different from the first crystal orientation. Again, the layer 70 and 90 can have the same crystal orientation.

Figure 10:
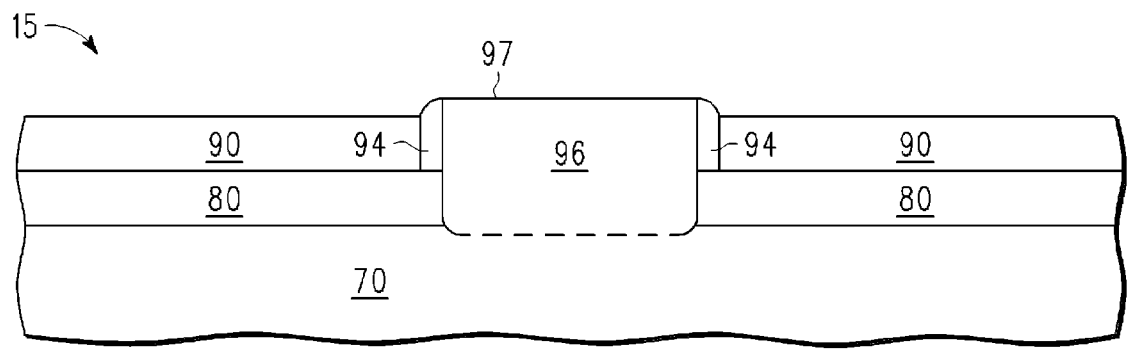
FIG. 10 illustrates processing subsequent to FIG. 9 after a polish of the epitaxial semiconductor layer.

FIG. 10 illustrates processing of a semiconductor wafer structure 15 subsequent to FIG. 9 after a polish and/or etch of the epitaxial semiconductor layer 96. Chemical mechanical polishing or any desired etchant process may be used to polish epi semiconductor layer 96, including dry etching, wet etching or oxidation of silicon and then stripping away the oxide. For example, before stripping the nitride mask layer 92, a silicon CMP process may be applied to planarize the SOI semiconductor layer 90 and the epitaxial semiconductor layer 96, followed by removal of the pad oxide 91. As illustrated, the upper surface of the polished epi semiconductor layer 96 is recessed below the (removed) hardmask layer 92, but is higher than the underlying SOI layer 90, though other etch heights may be obtained. In accordance with various embodiments, the polishing step may be skipped if the upper surface of the epitaxially grown semiconductor layer 96 is not significantly higher than the upper surface of the hardmask layer 92. Though the step height differential is exaggerated in FIG. 10, the resulting dual substrate structure 15 has a substantially coplanar surface that is obtained by polishing and/or etching the semiconductor layer 96 back to substantially the same level as the second semiconductor layer 90. Of course, the semiconductor layer 96 may be polished or etched back to a lesser or greater extent, but in any case is substantially coplanar with the second semiconductor layer 90 to facilitate CMOS processing.

As also shown in FIG. 10, the remaining nitride mask layer 92 and any oxide layer 91 (depicted in FIG. 9) are removed by the polish process or separately stripped. The removal of the nitride mask layer 92 and oxide layer 91 exposes the steps between the SOI semiconductor layer 90 and the epi semiconductor layer 96. Any desired stripping process, such as wet phosphoric acid etch, may be used that is capable of selectively removing the patterned nitride mask layers 92 from the structure 14. Similarly, the pad oxide layer 91 may also be optionally removed with an appropriate oxide etch process, such as wet hydrofluoric acid. In accordance with various embodiments, the stripping step may be skipped so that the nitride mask layer 92 and oxide layer 91 may be used to form an STI etch mask, which in turn is patterned to define the STI etch regions (as described herein below).

Figure 11:
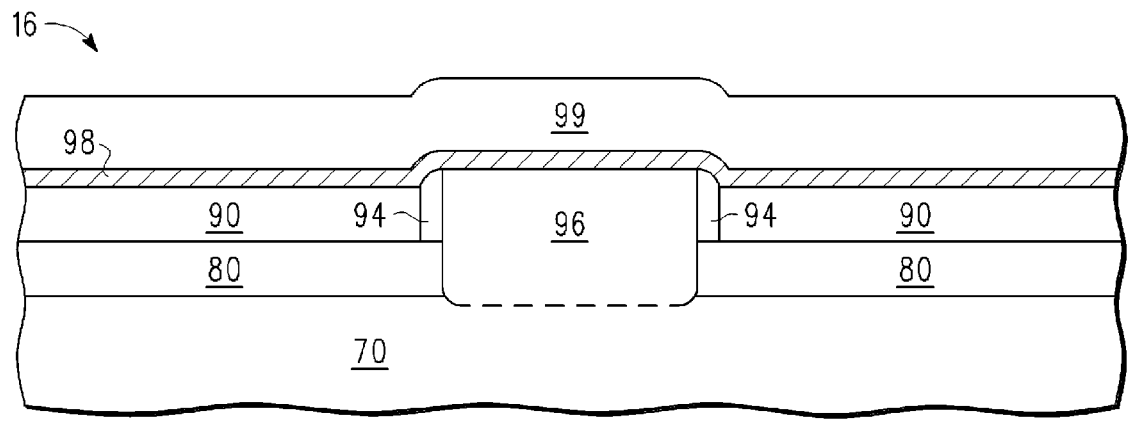
FIG. 11 illustrates processing subsequent to FIG. 10 after formation of a pad oxide and nitride hardmask layer over the semiconductor wafer structure.

FIG. 11 illustrates processing of a semiconductor wafer structure 16 subsequent to FIG. 10 after formation of a pad oxide layer 98 and nitride hardmask layer 99. As illustrated, a pad oxide layer 98 is formed by depositing or growing a thin layer of oxide or other dielectric material over the remaining SOI semiconductor layer 90, SOI sidewall oxide spacers 94 and epitaxial semiconductor layer 96. Subsequently, a nitride hardmask layer 99 is deposited over the pad oxide layer 98, again using any desired mask formation process.

Figure 12:
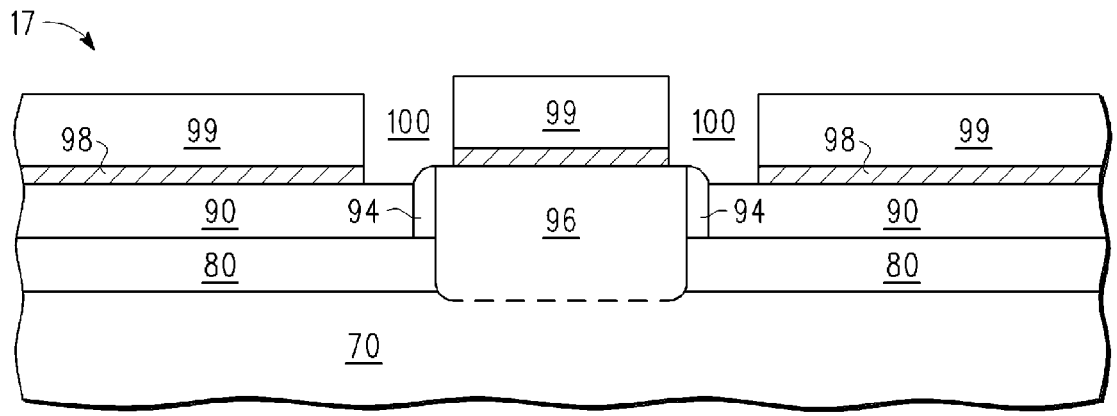
FIG. 12 illustrates processing subsequent to FIG. 11 after STI etch regions are formed in the nitride hardmask and pad oxide layers.

FIG. 12 illustrates processing of a semiconductor wafer structure 17 subsequent to FIG. 11 after STI etch regions 100 are formed by selectively etching the nitride hardmask and pad oxide layers 98, 99. As depicted, the STI etch regions 100 define the location where the STI regions will subsequently be formed after selective removal of the exposed SOI semiconductor layer 90, SOI sidewall oxide spacers 94 and epitaxial semiconductor layer 96. The STI etch regions 100 may be formed using any desired selective etch process. For example, a pattern transfer and etching process may be applied with one or more etching steps to selectively remove the unprotected portions of the nitride hardmask layer 99 and pad oxide layer 98, including a dry etching process such as reactive-ion etching, ion beam etching, plasma etching or laser etching, a wet etching process wherein a chemical etchant is employed or any combination thereof. As depicted, the STI etch regions are positioned to overlay the interface regions between the SOI semiconductor layer 90 and the epitaxial semiconductor layer 96, which also includes the SOI sidewall oxide spacers 94. As a result of using oxide spacer, a conventional STI etch process may be used which is selective to silicon nitride since the STI etch process need only remove silicon (from the underlying SOI layer 90 and epi layer 96) and silicon dioxide (from the SOI sidewall oxide spacers 94, and possibly from the buried oxide layer 80). By so positioning the STI etch regions 100, the STI etch process completely removes the SOI sidewall oxide spacers 94, including the "bird's beak" effect described above. Alternatively, the STI etch process may be controlled to trim the upper portions of the SOI sidewall oxide spacers 94, but to leave the SOI sidewall oxide spacers 94 substantially in place to serve as shallow trench isolation regions between the SOI semiconductor layer 90 and the epitaxial semiconductor layer 96.

Figure 13:
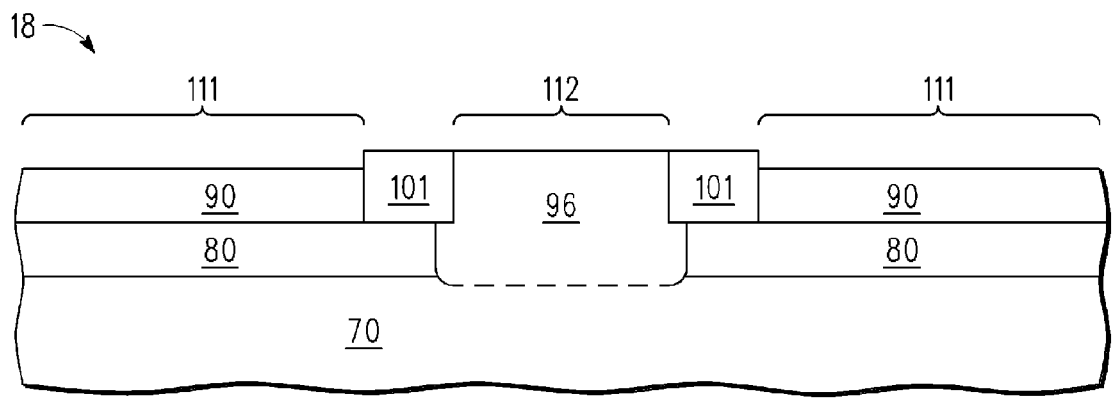
FIG. 13 illustrates processing subsequent to FIG. 12 after formation of STI regions in the semiconductor wafer structure.

FIG. 13 illustrates processing of a semiconductor wafer structure 18 subsequent to FIG. 12 after formation of STI regions 101 in the semiconductor wafer structure to provide electrical and physical isolation between transistor devices in the first semiconductor active device region 112 and transistor devices in the second semiconductor active device region 111. It will be appreciated that isolation regions 101 may also be formed as field oxide regions or isolation dielectric trenches using any desired process. For example, STI regions 101 comprised of a silicon-oxide (or other dielectric) compound may be formed by defining trench areas (e.g., STI etch regions 100) with mask and patterning steps, etching trenches in selected portions of the layers 80, 90, 94, 96 with an anisotropic STI etch process, filling the trenches with a deposited dielectric (such as high density plasma oxide), and polishing or etching the wafer to remove the excess dielectric. Alternatively, isolation dielectric trenches may be formed using conventional LOCOS processing in which silicon nitride is deposited and patterned to define the isolation regions and, thereafter, the exposed silicon of wafer structure 18 is thermally oxidized to form the isolation dielectric. Though the STI regions 101 are shown as extending down to the buried oxide layer 80, it will be appreciated that the STI regions 101 may instead be formed to extend completely through the buried oxide layer 80 and down to the underlying substrate layer 70.

Figure 14:
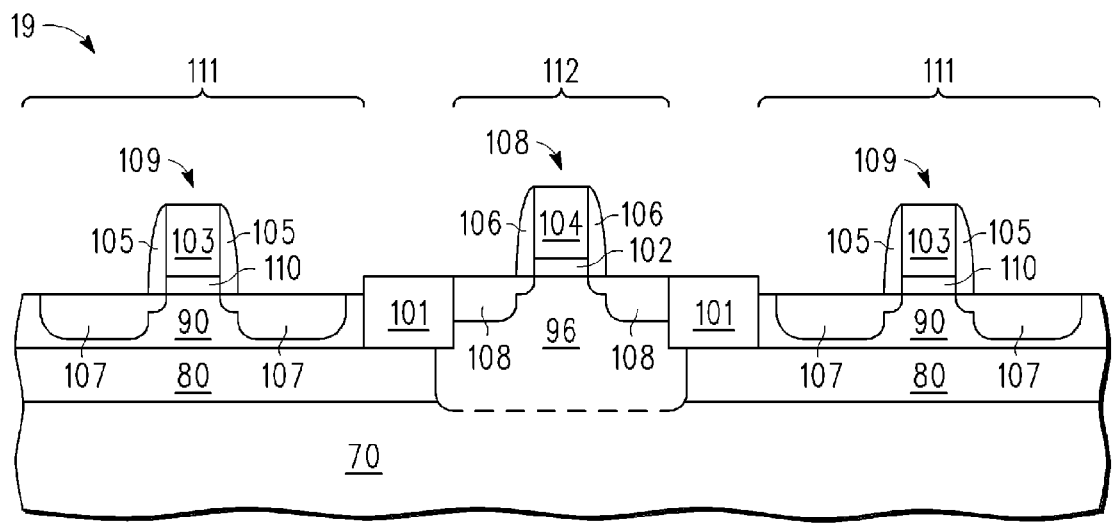
FIG. 14 illustrates processing subsequent to FIG. 13 after first and second semiconductor devices are formed.

FIG. 14 illustrates processing of the semiconductor wafer structure 19 subsequent to FIG. 13 after first and second semiconductor devices 108, 109 are formed. While other device structures may be used in connection with the planarized dual substrate wafer described herein, the example of FIG. 14 depicts transistor device structures formed from a gate dielectric material (such as silicon dioxide) and gate structures (such as polysilicon gates). In the implementation depicted in FIG. 14, PMOS and NMOS devices may be formed on the exposed semiconductor layers (i.e., the first and second semiconductor layers 96, 90), which may include well and body regions (not shown). Specifically, a first semiconductor device 108 is an NMOS device formed on a portion of the first epitaxial semiconductor layer 96, and a second semiconductor device 109 is a PMOS device formed on a portion of the second semiconductor layer 90. Alternatively, the first semiconductor device 108 may be a PMOS device and the second semiconductor device 109 may be an NMOS device. The allocation of device types to device regions may exploit the differing crystal orientation of the underlying layers 96, 90 to provide a high performance CMOS device where the PMOS device has improved hole mobility. This may be accomplished, for example, by forming the PMOS devices over the semiconductor material that has a (110) or (100) orientation, whereas the NMOS devices are formed over a semiconductor surface having a (100) or (110) orientation. In addition, the hole mobility of the PMOS devices may be further improved by forming the PMOS gate dielectrics and electrodes over a layer of compressed silicon germanium having a (110) orientation. The electron mobility of the NMOS devices may be further improved by forming the NMOS gate dielectrics and electrodes over a layer of tensile silicon having a (100) orientation. One can also make PMOS or NMOS devices both on bulk and SOI layers, depending on the device requirements.

In the example depicted in FIG. 14, the depicted wafer structure 19 includes a first epitaxial semiconductor layer 96—in which may be formed a body region (not shown)—and a second semiconductor layer 90—in which may be formed a well region (not shown)—that are laterally displaced and isolated with respect to one another by shallow trench isolation regions 101. However, it will be appreciated that either or both of the first and second semiconductor layers 90, 96 may be formed in whole or in part with epitaxially grown semiconductor material. The body and well regions contain impurities such that one is a p-doped and one is an n-doped. In the described embodiment, the body in the first epi layer 96 is a p-doped in which NMOS transistors are formed, and the well in the second semiconductor layer 90 is an n-doped in which PMOS transistors are formed.

Following the formation of wells and isolation trenches, at least a first gate dielectric layer is blanket deposited and/or grown across the entire wafer structure 19 and used to subsequently form the gate dielectric layers 110, 102. The first gate dielectric layer may be used to form at least part of the gate dielectric for all transistors on the wafer, or alternatively, the first gate dielectric layer may be used for only a first type of transistor formed on the wafer. In the depicted embodiment, the first gate dielectric layer may formed from a dielectric (e.g., silicon dioxide or a metal oxide) that is formed by oxidation, chemical vapor deposition, or by atomic layer deposition having a typical final thickness that is in the range of 0.1-10 nanometers.

After forming the first gate dielectric layer, one or more first gate electrodes 103, 104 are formed on the first gate dielectric layer above first and second semiconductor layers 90, 96 using any desired gate electrode formation sequence. For example, the gate electrodes 103, 104 may be formed from at least a first conductive layer (e.g., polysilicon, SiGe and/or metal) by depositing or forming a first conductive layer having a thickness in the range of 1-200 nanometers over the gate dielectric layer to form a first gate stack. Once the first gate stack is formed, any desired gate electrode etch processing steps may be used to form the desired gate electrode 103, 104 over the first gate dielectric layer.

With the etched gate electrodes 103, 104 in place, one or more sidewall spacers 105, 106 may be formed on the sides of the gate electrodes 103, 104 by growing and/or depositing a spacer layer over the wafer structure 90 and then anisotropically etching the spacer layer (and any exposed first gate dielectric layer) down to the respective semiconductor substrate layers 96, 90. With the spacers in place, source/drain regions may be formed in the semiconductor substrate layers 96, 90 using any desired implantation sequence. For example, the gate electrodes 104 in the first active device region 112 may be masked so that the source/drain regions 107 in the second active device region 111 may be formed by implanting dopants into the exposed regions of the second semiconductor substrate 90. As will be appreciated, the dopants may be implanted into source/drain regions 107 around the gate electrode 103 prior to forming sidewall spacers 105 and/or after forming sidewall spacers 105. In similar fashion, the gate electrodes 103 in the second active device region 111 may be masked so that the source/drain regions 108 in the first active device region 112 may be formed by implanting dopants into the exposed regions of the epi semiconductor substrate 96, again by implanting dopants around the gate electrodes 104 and/or by first forming sidewall spacers 106 on the sides of the gate electrodes 104 and then implanting the source/drain regions 108.

It will be appreciated that additional processing steps will be used to complete the fabrication of first and second gate electrodes into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

In one form there is provided herein a method for fabricating a dual surface semiconductor structure by providing or forming a first semiconductor layer having a first crystal orientation, and a second semiconductor layer (e.g., (100) p-type silicon or (110) p-type silicon), where the second semiconductor layer has a second crystal orientation and is electrically isolated from the first semiconductor layer by a buried insulator layer (e.g., an oxide layer). A trench opening that exposes the buried insulator layer is formed by selectively removing a portion of the second semiconductor layer in a first predetermined region, thereby leaving a remaining portion of the second semiconductor layer in a second predetermined region. In selected embodiments, the trench opening is formed by forming a patterned nitride mask layer over the second semiconductor layer, and then using the patterned nitride mask layer to selectively remove at least a portion of the second semiconductor layer, thereby form a trench opening which exposes a sidewall of the second semiconductor layer. A thermal oxide growth step is then applied to grow silicon dioxide on an exposed sidewall of the second semiconductor layer, thereby forming a sidewall oxide spacer by consuming part of the second semiconductor layer at the exposed sidewall. Subsequently, the trench opening is extended by selectively removing the buried insulator layer in the first predetermined region to expose the first semiconductor layer, thereby leaving at least a portion of the sidewall oxide spacer. At least part of the trench opening is filled by epitaxially growing a first epitaxial semiconductor material on at least an exposed surface of the first semiconductor layer (e.g., (110) n-type silicon or (100) n-type silicon), such as by selectively growing silicon, to form a first epitaxial semiconductor layer in the trench opening that has a third crystal orientation that is the same as the first crystal orientation. The first epitaxial semiconductor layer and the second semiconductor layer may then be planarized (e.g., by polishing the first epitaxial semiconductor layer with a CMP step) so that the first epitaxial semiconductor layer is substantially coplanar with the second semiconductor layer. On the planarized layers, one or more isolation regions may be formed between the first epitaxial semiconductor layer and the second semiconductor layer. In a selected embodiment, the isolation regions are formed by first forming a patterned nitride mask layer over the first epitaxial semiconductor layer and the second semiconductor layer having an opening over the portion of the sidewall oxide spacer; then using the patterned nitride mask layer to selectively remove at least the portion of the sidewall oxide spacer and part of the first epitaxial semiconductor layer and the second semiconductor layer, thereby form an isolation region trench; and finally filling the isolation region trench with a dielectric material (such as by depositing and polishing a layer of high density plasma oxide). In addition, a first gate electrode structure (including a first relatively high-k dielectric gate layer and a first conductive layer) may be formed over the first epitaxial semiconductor silicon layer, while a second gate electrode structure (including a second relatively high-k dielectric gate layer and a second conductive layer) may be formed over the second semiconductor layer. As formed, the first gate electrode structure may be used to form a first transistor of a first conductivity type, while the second gate electrode structure may be used to form a second transistor of a second conductivity type that is different from the first transistor.

In another form, there is provided method of forming an integrated circuit structure by first forming first and second semiconductor layers that are electrically isolated from each other by a buried oxide layer formed between the first and second semiconductor layers. As formed, the first and second semiconductor layers have crystallographic orientations that may be the same or different from one another. Over the second semiconductor layer, a pad oxide layer is formed, which may be followed by formation of an oxide polish stop layer (e.g., of TEOS) over the pad oxide layer, and then the hardmask layer is deposited, which may be implemented with an antireflective coating layer or a silicon nitride layer. The hardmask layer is patterned for use in selectively removing a portion of at least the second semiconductor layer (and optionally part of the buried oxide layer) to form a trench opening that exposes a portion of the buried oxide layer, thereby leaving a remnant portion of the second semiconductor layer having a sidewall. This may be done by patterning the hardmask layer to define a first opening over the second semiconductor layer, and then using the patterned hardmask layer to selectively remove a portion of the second semiconductor layer, thereby forming a first trench that exposes the first semiconductor layer. After the trench opening is formed, oxide sidewall spacers are grown on the sidewall of the second semiconductor layer using an oxide formation process, such a thermal oxidation. While selectively removing a portion of the buried oxide layer to extend the trench opening and expose a portion of the first semiconductor layer, part of the oxide sidewall spacers are removed without removing the entirety of the oxide sidewall spacers. The process of removing the buried oxide layer trims the oxide sidewall spacer, thereby leaving at least a portion of the oxide sidewall spacer to prevent the second semiconductor layer from growing epitaxial semiconductor material when the first epitaxial semiconductor material is grown. With the remnant sidewall oxide spacers in place, a first epitaxial semiconductor material is epitaxially grown on an exposed surface of the first semiconductor layer to form a first epitaxial semiconductor layer that is above the second semiconductor layer, thereby at least substantially filling the trench opening. As formed, the first epitaxial semiconductor layer has a crystal orientation that is the same as the first crystal orientation. Subsequently, the hardmask layer may be removed to expose any underlying oxide polish stop layer, or the hardmask layer may be left in place. In either case, the first epitaxial semiconductor layer is polished (e.g., with a CMP process) until substantially coplanar with the second semiconductor layer. Finally, isolation regions are formed between the first epitaxial semiconductor layer and the second semiconductor layer by selectively removing the oxide sidewall spacer and forming in its place a planarized high density plasma oxide layer.

In yet another form, there is provided a method for fabricating FET devices on dual substrates. Under the method, a semiconductor wafer structure is provided in which a nitride mask is formed over an SOI semiconductor layer and an underlying first semiconductor layer, where the SOI semiconductor layer and first semiconductor layer are separated by an insulator layer. Subsequently, the insulator layer is exposed in a first area (e.g., by selectively etching SOI semiconductor layer) to form a trench opening in the semiconductor wafer structure, thereby exposing a sidewall on the SOI semiconductor layer. With the trench opening formed, an oxide sidewall spacer is thermally grown on the exposed sidewall of the SOI semiconductor layer by consuming part of the SOI semiconductor layer. Part of the oxide sidewall spacer is then trimmed while the exposed insulator layer is selectively removed to extend the trench opening, thereby exposing the first semiconductor layer. In the trench opening, an epitaxial semiconductor material is selectively grown to fill at least part of the trench opening so that the trench opening is filled at least in part with a first epi layer, and then the first epi layer and the SOI semiconductor layer are planarized to be substantially coplanar. On the planarized first epi layer and SOI semiconductor layers, FET devices are formed.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 14 is for first well (not shown) in the epi semiconductor substrate layer 96 to be an n-doped well and the second well (not shown) in the second semiconductor layer 90 to be p-doped. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes forms an SOI sidewall spacer with a minimum of complexity that can be readily removed with conventional STI etch processes, thereby promoting Dual-Surface Orientation (DSO) and Bulk on SOI integration while reducing or eliminating the process and performance limitations associated with conventional fabrication techniques. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a semiconductor structure, comprising:
   providing a first semiconductor layer having a first crystal orientation and a second semiconductor layer over at least part of the first semiconductor layer, where the second semiconductor layer has a second crystal orientation and is electrically isolated from the first semiconductor layer by an insulator layer;
   forming a trench opening by selectively removing a portion of the second semiconductor layer to expose the insulator layer in a first region and to leave a remaining portion of the second semiconductor layer in a second region;
   thermally growing silicon dioxide on an exposed sidewall of the second semiconductor layer, thereby forming a sidewall oxide spacer by consuming part of the second semiconductor layer at the exposed sidewall;
   extending the trench opening by selectively removing the insulator layer in the first region to trim the sidewall oxide spacer and expose the first semiconductor layer, thereby leaving a portion of the sidewall oxide spacer to protect the remaining portion of the second semiconductor layer against epitaxial growth; and
   filling at least part of the trench opening by epitaxially growing a first epitaxial semiconductor material on at least an exposed surface of the first semiconductor layer to form a first epitaxial semiconductor layer in the trench opening that has a third crystal orientation that is the same as the first crystal orientation.

2. The method of claim 1, further comprising planarizing the first epitaxial semiconductor layer and the second semiconductor layer so that the first epitaxial semiconductor layer is substantially coplanar with the second semiconductor layer.

3. The method of claim 2, where planarizing the first epitaxial semiconductor layer and the second semiconductor layer comprises a chemical mechanical polish step.

4. The method of claim 1, further comprising forming an isolation region between the first epitaxial semiconductor layer and the second semiconductor layer.

5. The method of claim 4, where forming an isolation region comprises:
   forming a patterned mask layer over the first epitaxial semiconductor layer and the second semiconductor layer having an opening over the portion of the sidewall oxide spacer;
   using the patterned mask layer to selectively remove at least the portion of the sidewall oxide spacer and part of the first epitaxial semiconductor layer and the second semiconductor layer, thereby form an isolation region trench; and filling the isolation region trench with a dielectric material.

6. The method of claim 1, where the second semiconductor layer comprises (100) p-type silicon and the first semiconductor layer comprises (110) n-type silicon.

7. The method of claim 1, where the second semiconductor layer comprises (110) p-type silicon and the first semiconductor layer comprises (100) n-type silicon.

8. The method of claim 1, where forming trench opening comprises:

forming a patterned mask layer over the second semiconductor layer; and using the patterned mask layer to selectively remove at least a portion of the second semiconductor layer, thereby forming a trench opening which exposes a sidewall of the second semiconductor layer.

9. The method of claim 1, where epitaxially growing the first epitaxial semiconductor material comprises a selective silicon growth step that fills the trench opening.

10. The method of claim 1, further comprising:

forming a first gate electrode structure over the first epitaxial semiconductor layer, said first gate electrode structure comprising at least a first relatively high-k dielectric gate layer and a first conductive layer; and forming a second gate electrode structure over the second semiconductor layer, said second gate electrode structure comprising at least a second relatively high-k dielectric gate layer and a second conductive layer.

11. The method of claim 10, where the first gate electrode structure is used to form a first transistor of a first conductivity type, and the second gate electrode structure is used to form a second transistor of a second conductivity type that is different from the first transistor.

12. The method of claim 1, where the second crystal orientation is the same as the first crystal orientation.

13. A method of forming an integrated circuit structure, comprising:

forming first and second semiconductor layers that are electrically isolated from each other by a buried oxide layer located between the first and second semiconductor layers, where the first semiconductor layer has a first crystallographic orientation and where the second semiconductor layer has a second crystallographic orientation;

depositing a hardmask layer over the second semiconductor layer;

selectively removing a portion of at least the hardmask layer and second semiconductor layer to form a trench opening to expose a portion of the buried oxide layer, thereby leaving a remnant portion of the second semiconductor layer having a sidewall;

growing an oxide sidewall spacer on the sidewall of the second semiconductor layer with an oxide formation process;

selectively trimming the oxide sidewall spacer and removing a portion of the buried oxide layer to extend the trench opening and expose a portion of the first semiconductor layer without removing the entirety of the oxide sidewall spacer;

epitaxially growing a first epitaxial semiconductor material on at least an exposed surface of the first semiconductor layer to form a first epitaxial semiconductor layer that is above the second semiconductor layer, where the first epitaxial semiconductor layer has a crystal orientation that is the same as the first crystal orientation; and polishing the first epitaxial semiconductor layer until substantially coplanar with the second semiconductor layer.

14. The method of claim 13, where the hardmask layer comprises an antireflective coating layer or a silicon nitride layer.

15. The method of claim 13, where selectively removing a portion of at least the hardmask layer and second semiconductor layer comprises:

patterning the hardmask layer to define a first opening over the second semiconductor layer; and using the patterned hardmask layer to selectively remove a portion of the second semiconductor layer, thereby forming a first trench that exposes the first semiconductor layer.

16. The method of claim 13, where selectively removing a portion of at least the hardmask layer and second semiconductor layer comprises selectively removing a portion of the hardmask layer, the second semiconductor layer and part of the buried oxide layer.

17. The method of claim 13, where selectively trimming the oxide sidewall spacer and removing a portion of the buried oxide layer trims the oxide sidewall spacer with a single dry etch process, thereby leaving at least a portion of the oxide sidewall spacer to prevent the second semiconductor layer from growing epitaxial semiconductor material when the first epitaxial semiconductor material is grown.

18. The method of claim 13, further comprising forming an isolation region between the first epitaxial semiconductor layer and the second semiconductor layer by selectively removing any remaining portion of the oxide sidewall spacer and forming in its place a planarized high density plasma oxide layer.

19. The method of claim 13, where the first and second crystallographic orientations have the same orientation.

20. The method of claim 13, further comprising:

forming a first gate electrode structure of a first conductivity type over the first epitaxial semiconductor layer; and forming a second gate electrode structure of a second conductivity type over the second semiconductor layer, where the first conductivity type is different from the second conductivity type.

21. A method for fabricating FET devices on dual substrates, comprising:

providing a semiconductor wafer structure in which a nitride mask is formed over an SOI semiconductor layer and an underlying first semiconductor layer, where the SOI semiconductor layer and first semiconductor layer are separated by an insulator layer;

exposing the insulator layer in a first area by forming a trench opening in the semiconductor wafer structure, thereby exposing a sidewall on the SOI semiconductor layer;

thermally growing an oxide sidewall spacer on the exposed sidewall of the SOI semiconductor layer by consuming part of the SOI semiconductor layer;

trimming part of the oxide sidewall spacer while selectively removing the exposed insulator layer to extend the trench opening, thereby exposing the first semiconductor layer;

selectively growing an epitaxial semiconductor material to fill at least part of the trench opening so that the trench opening is filled at least in part with a first epi layer;

planarizing the first epi layer and the SOI semiconductor layer to be substantially coplanar; and forming FET devices over the planarized first epi layer and SOI semiconductor layer.

* * * * *